United States Patent
Fujii et al.

(10) Patent No.: US 10,112,377 B2
(45) Date of Patent: Oct. 30, 2018

(54) SUPPORTING MEMBER SEPARATION METHOD AND SUPPORTING MEMBER SEPARATION APPARATUS

(71) Applicant: Tokyo Ohka Kogyo Co., Ltd., Kawasaki (JP)

(72) Inventors: Yasushi Fujii, Kawasaki (JP); Shinji Takase, Kawasaki (JP)

(73) Assignee: TOKYO OHKA KOGYO CO., LTD., Kawasaki-Shi (JP)

( * ) Notice: Subject to any disclaimer, the term of this patent is extended or adjusted under 35 U.S.C. 154(b) by 143 days.

(21) Appl. No.: 14/377,711

(22) PCT Filed: Jan. 17, 2013

(86) PCT No.: PCT/JP2013/050823
§ 371 (c)(1),
(2) Date: Aug. 8, 2014

(87) PCT Pub. No.: WO2013/125267
PCT Pub. Date: Aug. 29, 2013

(65) Prior Publication Data
US 2015/0083343 A1    Mar. 26, 2015

(30) Foreign Application Priority Data
Feb. 20, 2012   (JP) .................. 2012-034433

(51) Int. Cl.
   *B32B 38/10*   (2006.01)
   *B32B 43/00*   (2006.01)
   (Continued)

(52) U.S. Cl.
   CPC ........ *B32B 43/006* (2013.01); *B32B 38/0008* (2013.01); *H01L 21/6835* (2013.01);
   (Continued)

(58) Field of Classification Search
   CPC . B32B 38/10; B32B 43/006; Y10T 156/1158; Y10T 156/1195; Y10T 156/1917; Y10T 156/1994
   (Continued)

(56) References Cited

U.S. PATENT DOCUMENTS 6,127,199 A   10/2000  Shimoda et al.
6,372,608 B1   4/2002  Shimoda et al.
(Continued)

FOREIGN PATENT DOCUMENTS

CN   1591108 A   3/2005
CN   1826224 A   8/2006
(Continued)

OTHER PUBLICATIONS

International Search Report in PCT/JP2013/050823 dated Mar. 5, 2013.
(Continued)

*Primary Examiner* — Mark A Osele
*Assistant Examiner* — Nickolas Harm
(74) *Attorney, Agent, or Firm* — Knobbe, Martens, Olson & Bear, LLP

(57) ABSTRACT

A supporting member separation method of separating a laminate formed by laminating a substrate, an adhesive layer, a release layer which is changed in quality by absorbing light, and a support plate in this order, the method including an irradiation step in which irradiation of laser light which is pulse-oscillated with a pulse having a pulse width of 20 ns or greater is performed to the release layer.

8 Claims, 2 Drawing Sheets

(51) Int. Cl.
*H01L 21/683* (2006.01)
*B32B 38/00* (2006.01)

(52) U.S. Cl.
CPC ....... *B32B 38/10* (2013.01); *B32B 2310/0843* (2013.01); *B32B 2457/14* (2013.01); *H01L 2221/6834* (2013.01); *H01L 2221/68318* (2013.01); *Y10T 156/1158* (2015.01); *Y10T 156/1195* (2015.01); *Y10T 156/1917* (2015.01); *Y10T 156/1994* (2015.01)

(58) Field of Classification Search
USPC .................... 156/157, 304.1, 304.5, 502
See application file for complete search history.

(56) References Cited

U.S. PATENT DOCUMENTS

| | | | |
|---|---|---|---|
| 6,521,511 | B1 | 2/2003 | Inoue et al. |
| RE38,466 | E | 3/2004 | Shimoda et al. |
| RE40,601 | E | 12/2008 | Shimoda et al. |
| 2002/0146893 | A1 | 10/2002 | Shimoda et al. |
| 2003/0047280 | A1* | 3/2003 | Takayama et al. ........... 156/344 |
| 2003/0224582 | A1 | 12/2003 | Shimoda et al. |
| 2004/0219762 | A1 | 11/2004 | Shimoda et al. |
| 2005/0087289 | A1 | 4/2005 | Toyoda |
| 2006/0030122 | A1 | 2/2006 | Shimoda et al. |
| 2006/0234024 | A1 | 10/2006 | Abe et al. |
| 2007/0010067 | A1 | 1/2007 | Shimoda et al. |
| 2007/0051469 | A1* | 3/2007 | Bossi et al. .................... 156/344 |
| 2007/0077685 | A1 | 4/2007 | Noda et al. |
| 2008/0014532 | A1 | 1/2008 | Kessel et al. |
| 2009/0017248 | A1 | 1/2009 | Larson et al. |
| 2009/0017323 | A1 | 1/2009 | Webb et al. |
| 2009/0042356 | A1 | 2/2009 | Takayama et al. |
| 2009/0133812 | A1 | 5/2009 | Noda et al. |
| 2009/0133820 | A1* | 5/2009 | Sato et al. .................... 156/247 |
| 2009/0291516 | A1 | 11/2009 | Takayama et al. |
| 2011/0095107 | A1* | 4/2011 | Clark ......................... 241/24.12 |
| 2012/0064735 | A1* | 3/2012 | Zhang et al. ................. 438/795 |
| 2012/0145331 | A1* | 6/2012 | Gomez et al. ................. 156/712 |
| 2012/0217501 | A1 | 8/2012 | Takayama et al. |
| 2013/0089734 | A1 | 4/2013 | Nakamura et al. |
| 2013/0199732 | A1* | 8/2013 | Niwa et al. ................... 156/712 |

FOREIGN PATENT DOCUMENTS

| | | | |
|---|---|---|---|
| EP | 1151853 A | 11/2001 | |
| JP | 10-125929 | 5/1998 | |
| JP | 11-26733 | 1/1999 | |
| JP | 2003-163338 | 6/2003 | |
| JP | 2004-179649 | 6/2004 | |
| JP | 2005-159155 | 6/2005 | |
| JP | 2005-183689 | 7/2005 | |
| JP | 2010-188385 | 9/2010 | |
| TW | 200621501 A | 7/2006 | |
| TW | 1299019 | 7/2008 | |
| TW | 201016466 A | 5/2010 | |
| TW | 201204552 | 2/2012 | |
| WO | WO 2010029341 A2 * | 3/2010 | ........... B41C 1/1041 |

OTHER PUBLICATIONS

Office Action dated Oct. 6, 2016 in TW Patent Application No. TW 102103730.

\* cited by examiner

SUPPORTING MEMBER SEPARATION METHOD AND SUPPORTING MEMBER SEPARATION APPARATUS

This application is the U.S. National Phase under 35 U.S.C. § 371 of International Application No. PCT/JP2013/050823, filed Jan. 17, 2013, designating the U.S., and published in Japanese as WO 2013/125267 on Aug. 29, 2013, which claims priority to Japanese Patent Application No. 2012-034433, filed Feb. 20, 2012, the entire content of which is incorporated herein by reference.

TECHNICAL FIELD

The present invention relates to a supporting member separation method and a supporting member separation apparatus.

BACKGROUND ART

As a method for manufacturing semiconductor chips in which a supporting member is attached to a semiconductor wafer, the semiconductor wafer is processed, and thus, the supporting member is separated therefrom, a method described in PTL 1 is known. In the method described in PTL 1, a light-transmitting supporting member and a semiconductor wafer are attached through a photothermal conversion layer and an adhesive layer provided on the supporting member side, the semiconductor wafer is processed, and then, radiant energy irradiation is performed from the supporting member side to decompose the photothermal conversion layer, whereby the semiconductor wafer is separated from the supporting member.

CITATION LIST

Patent Literature

[PTL 1] JP-A-2005-159155 (published on Jun. 16, 2005)

SUMMARY OF INVENTION

Technical Problem

In recent years, thinning, miniaturization, and weight reduction of electronic devices such as an IC card or a cellular phone are required. To meet these requirements, it is required that thin semiconductor chips be also used as the semiconductor chips incorporated. For this reason, although a thickness (film thickness) of a wafer substrate which is a base of the semiconductor chip is 125 µm to 150 µm at present, it is known that a thickness of 25 µm to 50 µm is required for the chip for the next generation. Therefore, to obtain the wafer substrate having the thickness described above, a thinning step of the wafer substrate is essential.

Since the strength of the wafer substrate is reduced by thinning, to prevent a thinned wafer substrate from being damaged, during a manufacturing process, a structure such as a circuit is mounted on the wafer substrate while automatically transferring in a state in which a support plate is attached to the wafer substrate. Then, after the manufacturing process, the wafer substrate is separated from the support plate. Therefore, during the manufacturing process, it is preferable that the wafer substrate and the support plate be firmly attached, and after the manufacturing process, it is preferable that the wafer substrate can smoothly separate from the support plate.

In a case where the wafer substrate and the support plate are firmly attached, depending on adhesive materials, it is difficult to separate the support plate from the wafer substrate without damaging the structure mounted on the wafer substrate. Therefore, development of very difficult temporary tacking technology in which during the manufacturing process, a strong attachment between the wafer substrate and the support plate is realized, and after the manufacturing process, separation is performed without damaging the element mounted on the wafer substrate has been required.

As described in PTL 1, when the supporting member is separated from the semiconductor wafer, if radiant energy irradiation is performed from the supporting member side, the irradiation laser light may leak from the photothermal conversion layer. Then, the leakage light reaches a substrate such as a semiconductor wafer, or an electronic circuit mounted on the substrate, a display element, or the like, and thus, the leakage light adversely affects them in some cases. As a method for decreasing such leakage light, increasing the thickness of the photothermal conversion layer is considered, however, it is difficult in terms of the throughput and the cost.

The present invention has been made in consideration of the above problems, and a main object of the present invention is to provide a supporting member separation method in which during the manufacturing process, a strong attachment between the substrate and the support plate is realized, after the manufacturing process, the substrate and the supporting member can be easily separated by irradiation with light, and the adverse effects on the substrate surface by the light are prevented and a supporting member separation apparatus.

Solution to Problem

To solve the above problems, according to the present invention, there is provided a supporting member separation method of separating a laminate formed by laminating a substrate, an adhesive layer, a release layer which is changed in quality by absorbing light, and a supporting member in this order, the method including: an irradiation step in which irradiation of laser light which is pulse-oscillated with a pulse having a pulse width of 20 ns or greater is performed to the above release layer.

In addition, according to the present invention, there is provided a supporting member separation apparatus for separating a laminate formed by laminating a substrate, an adhesive layer, a release layer which is changed in quality by absorbing light, and a supporting member in this order, the apparatus including: an irradiation means in which irradiation of laser light which is pulse-oscillated with a pulse having a pulse width of 20 ns or greater is performed to the above release layer.

Advantageous Effects of Invention

The supporting member separation method and the supporting member separation apparatus according to the present invention exhibit the effects that during the manufacturing process, a strong attachment between the substrate and the supporting member is realized, after the manufacturing process, the substrate and the supporting member can be easily separated by irradiation with light, and the adverse effects on the substrate by the light can be prevented.

DESCRIPTION OF EMBODIMENTS

[Supporting Member Separation Method]

Figure 1:
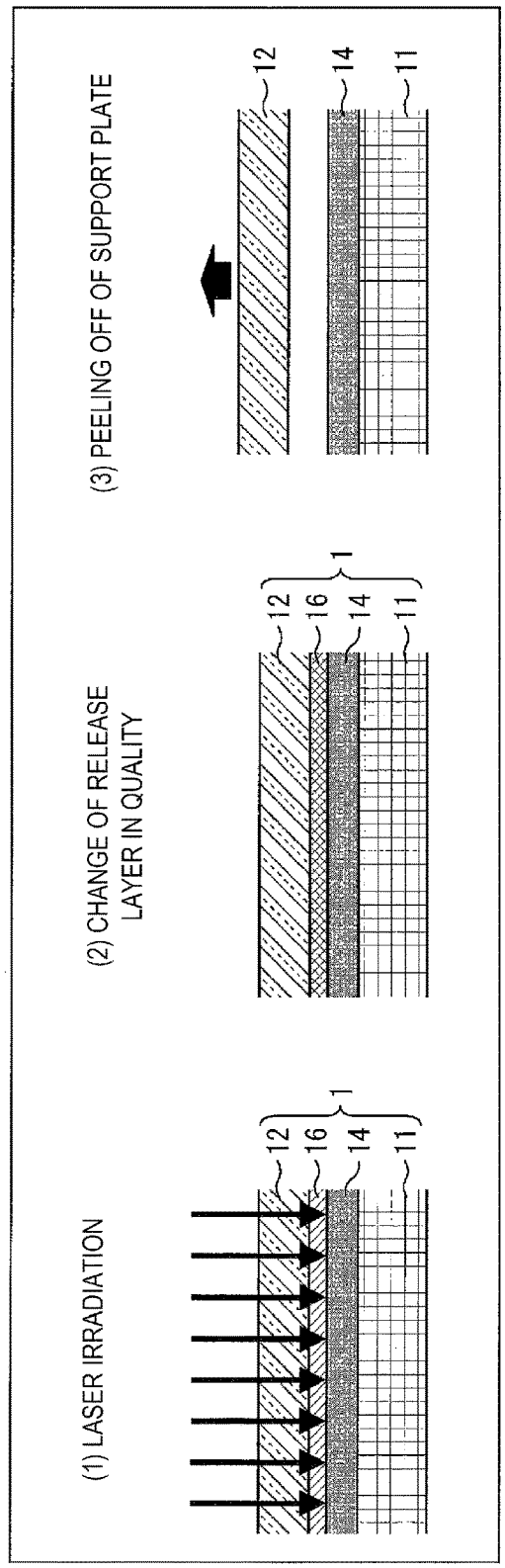
FIG. 1 is a diagram showing an irradiation step of laser light and a separation step of a substrate and a support plate.

Next, the supporting member separation method according to the present embodiment will be described with reference to FIG. 1. FIG. 1 is a diagram showing a separation step of a support plate. In the supporting member separation method, a support plate 12 is separated from a laminate 1 formed by laminating a substrate 11, an adhesive layer 14, a release layer 16 which is changed in quality by absorbing light, and the support plate (supporting member) 12 in this order. The substrate 11 and the support plate 12 are attached through the adhesive layer 14 and the release layer 16.

(Substrate 11)

The substrate 11 is subjected to processes such as thinning, mounting, and the like, in a state of being supported by the support plate 12. As the substrate 11, there is no limitation to the wafer substrate, and it is possible to use any substrate such as a thin film substrate, a flexible substrate, and the like. In addition, fine structure of an electronic device such as an electronic circuit may be formed on a surface of the adhesive layer 14 side of the substrate 11.

(Support Plate 12)

The support plate 12 is a supporting member which supports the substrate 11, and has a light transmittance. For this reason, when light is irradiated toward the support plate 12 from the outside of a laminate 1, the light reaches the release layer 16 through the support plate 12. In addition, the support plate 12 is not required to transmit all light, and is not limited as long as it can transmit light (having a desired wavelength) to be absorbed in the release layer 16.

The support plate 12 is a plate which supports the substrate 11, and the support plate 12 may have strength necessary to prevent the substrate 11 from being damaged or deformed at the time of processing such as thinning, transferring, and mounting of the substrate 11. From these viewpoints, as the support plate 12, plates formed of glass, silicon, or an acrylic resin are exemplified.

(Release Layer 16)

The release layer 16 is a layer formed of a material which is changed in quality by absorbing light irradiated through the support plate 12. In the specification, "change in quality" of the release layer 16 refers to a phenomenon in which the release layer becomes a state in which the release layer 16 may be broken in response to a slight external force, or the adhesive force with the layers in contact with the release layer 16 is decreased. As a result of change in quality of the release layer 16 generated by absorbing light, the release layer 16 loses the strength or the adhesiveness before being irradiated with light. Therefore, by applying a slight external force (for example, lifting the support plate 12), the release layer 16 is broken, and thus it is possible to easily separate the support plate 12 and the substrate 11.

In addition, change of the release layer 16 in quality can be (pyrogenic or non-pyrogenic) decomposition, crosslinking, change in a configuration or dissociation of functional groups (and hardening, degasification, contraction or expansion of the release layer associated with these) due to the energy of the absorbed light. The change of the release layer 16 in quality occurs as a result of the absorption of light by a material constituting the release layer 16. Thus, the type of the change of the release layer 16 in quality can vary depending on the type of a material constituting the release layer 16.

The release layer 16 is provided on the surface of the side of the support plate 12 where the substrate 11 is attached through the adhesive layer 14. That is, the release layer 16 is provided between the support plate 12 and the adhesive layer 14.

For example, the thickness of the release layer 16 is preferably 0.05 μm to 50 μm, and more preferably 0.1 μm to 10 μm. When the thickness of the release layer 16 is within the range of 0.05 μm to 50 μm, the release layer 16 can be changed in quality as desired by irradiation with light for a short time and irradiation with light having low energy. In addition, the thickness of the release layer 16 is particularly preferably within the range of equal to or less than 1 μm from the viewpoint of productivity.

Moreover, in the laminate 1, other layers may be further formed between the release layer 16 and the support plate 12. In this case, the other layers may be constituted by a material which transmits light. Thus, it is possible to suitably add a layer which gives desirable properties to the laminate 1 without preventing the incidence of light into the release layer 16. The wavelength of light which can be used is different depending on the type of material constituting the release layer 16. Thus, the material constituting the other layers can be suitably selected from materials which can transmit light having a wavelength that can change materials constituting the release layer 16 in quality, and the materials are not required to transmit all light.

In addition, the release layer 16 is preferably formed of only material having a structure which absorbs light, but it is also possible to form the release layer by adding a material not having a structure which absorbs light in such a range where no essential feature of the invention is impaired. In addition, a surface of the side opposite to the adhesive layer 14 in the release layer 16 is preferably flat (irregularities are not formed). Thus, formation of the release layer 16 can be easily performed, and uniform attachment can be performed at the time of adhesion.

As the release layer 16, a layer in which a material constituting the release layer 16 as shown below is formed into a film shape in advance, and then, attached to the support plate 12 may be used, and a layer in which a material constituting the release layer 16 is coated on the support plate 12, and then, solidified in a film shape may be used. A method for applying a material constituting the release layer 16 on the support plate 12 can be suitably selected from methods known in the related art such as deposition by a chemical vapor deposition (CVD) method in accordance with the type of the material constituting the release layer 16.

The release layer 16 may be changed in quality by absorbing irradiation light from a laser. That is, light with which the release layer 16 is irradiated to change the release layer 16 in quality may be irradiation light from the laser. As a laser for emitting light with which the release layer 16 is irradiated, laser lights such as solid-state lasers including a YAG laser, a ruby laser, a glass laser, a $YVO_4$ laser, an LD laser, a fiber laser, and the like, liquid lasers including a dye laser and the like, gas lasers including a $CO_2$ laser, an excimer laser, an Ar laser, a He—Ne laser, and the like, a semiconductor laser and a free electron laser, or non-laser lights can be exemplified. A laser for emitting light with which the release layer 16 is irradiated can be suitably selected depending on materials constituting the release layer 16, and a laser that emits light having a wavelength that can change materials constituting the release layer 16 in quality may be selected.

<Polymer Including a Structure Having Light Absorption Properties in a Repeating Unit Thereof>

The release layer 16 may contain a polymer including a structure having light absorption properties in the repeating unit thereof. The polymer is changed in quality by irradiation with light. The change of the polymer in quality is generated since the structure absorbs light irradiated. As a result of the change of the polymer in quality, the release layer 16 loses the strength and the adhesiveness before being irradiated with light. Therefore, by applying a slight external force (for example, lifting the support plate 12), the release layer 16 is broken, and thus it is possible to easily separate the support plate 12 and the substrate 11.

The structure having light absorption properties is a chemical structure that absorbs light and changes the polymer in quality that contains the structure as a repeating unit. For example, the structure is an atomic group containing a conjugated π electron system formed of a substituted benzene ring or an unsubstituted benzene ring, a condensed ring or a heterocyclic ring. In more detail, the structure may be a cardo structure, or a benzophenone structure, a diphenyl sulfoxide structure, a diphenyl sulfone structure (bisphenyl sulfone structure), with a diphenyl structure or a diphenylamine structure present at the side chain of the polymer.

In a case where the structure is present at the side chain of the polymer, the structure can be represented by the following formulas.

[Chemical formula 1]

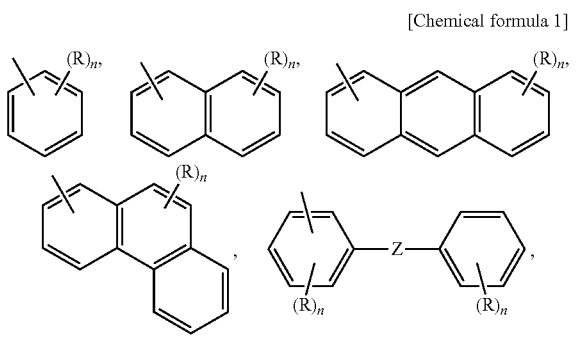

In the formula, R each independently represents an alkyl group, an aryl group, a halogen, a hydroxyl group, a ketone group, a sulfoxide group, a sulfone group or $N(R_1)(R_2)$ (where $R_1$ and $R_2$ each independently represent a hydrogen atom or an alkyl group having 1 to 5 carbon atoms), Z is absent or represents —C(=O)—, —SO$_2$—, —SO— or —NH—, and n represents 0 or an integer of 1 to 5.

In addition, for example, the polymer contains a repeating unit represented by any one of (a) to (d), is represented by (e), or contains a structure of (f) in the main chain, among the following formula.

[Chemical formula 2]

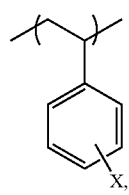
(a)

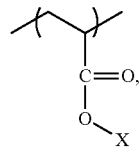
(b)

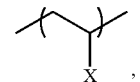
(c)

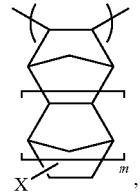
(d)

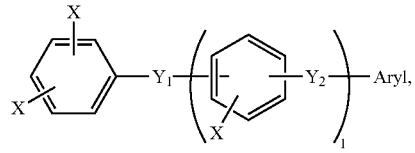
(e)

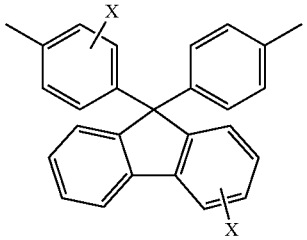
(f)

In the formula, l is an integer of equal to or greater than 1, m is 0 or an integer of 1 to 2, X is any one of the formula shown in "Chemical formula 1" described above in (a) to (e), any one of the formula shown in "Chemical formula 1" described above in (f), or is absent, and $Y_1$ and $Y_2$ represent each independently —CO— or SO$_2$—. l is preferably an integer of equal to or less than 10.

Examples of a benzene ring, a condensed ring and a heterocyclic ring shown in "Chemical formula 1" described above include phenyl, substituted phenyl, benzyl, substituted benzyl, naphthalene, substituted naphthalene, anthracene, substituted anthracene, anthraquinone, substituted anthraquinone, acridine, substituted acridine, azobenzene, substituted azobenzene, fluorim, substituted fluorim, fluorimon, substituted fluorimon, carbazole, substituted carbazole, N-alkylcarbazole, dibenzofuran, substituted dibenzofuran, phenanthrene, substituted phenanthrene, pyrene and substituted pyrene. In a case where the exemplified substituent has a substitution, for example, the substituent is selected from alkyl, aryl, a halogen atom, alkoxy, nitro, aldehyde, cyano, amide, dialkylamino, sulfonamide, imide, carboxylic acid, carboxylic ester, sulfonic acid, sulfonic ester, alkylamino, and arylamino.

Among the substituents shown in "Chemical formula 1" described above, examples of a case where a substituent is a fifth substituent having two phenyl groups, and Z is —SO$_2$— include bis(2,4-dihydroxyphenyl)sulfone, bis(3,4-dihydroxyphenyl)sulfone, bis(3,5-dihydroxyphenyl)sulfone, bis(3,6-dihydroxyphenyl)sulfone, bis(4-hydroxyphenyl)sulfone, bis(3-hydroxyphenyl)sulfone, bis(2-hydroxyphenyl) sulfone, and bis(3,5-dimethyl-4-hydroxyphenyl)sulfone.

Among the substituents shown in "Chemical formula 1" described above, examples of a case where a substituent is a fifth substituent having two phenyl groups, and Z is —SO— include, bis(2,3-dihydroxyphenyl)sulfoxide, bis(5-chloro-2,3-dihydroxyphenyl)sulfoxide, bis(2,4-dihydroxyphenyl)sulfoxide, bis(2,4-dihydroxy-6-methylphenyl)sulfoxide, bis(5-chloro-2,4-dihydroxyphenyl)sulfoxide, bis(2,5-dihydroxyphenyl)sulfoxide, bis(3,4-dihydroxyphenyl)sulfoxide, bis(3,5-dihydroxyphenyl)sulfoxide, bis(2,3,4-trihydroxyphenyl)sulfoxide, bis(2,3,4-trihydroxy-6-methylphenyl)-sulfoxide, bis(5-chloro-2,3,4-trihydroxyphenyl)sulfoxide, bis(2,4,6-trihydroxyphenyl)sulfoxide, bis(5-chloro-2,4,6-trihydroxyphenyl)sulfoxide.

Among the substituents shown in "Chemical formula 1" described above, examples of a case where a substituent is a fifth substituent having two phenyl groups, and Z is —C(=O)— include, 2,4-dihydroxybenzophenone, 2,3,4-trihydroxybenzophenone, 2,2',4,4'-tetrahydroxybenzophenone, 2,2',5,6'-tetrahydroxybenzophenone, 2-hydroxy-4-methoxybenzophenone, 2-hydroxy-4-oxtoxybenzophenone, 2-hydroxy-4-dodecyloxybenzophenone, 2,2'-dihydroxy-4-methoxybenzophenone, 2,6-dihydroxy-4-methoxybenzophenone, 2,2'-dihydroxy-4,4'-dimethoxybenzophenone, 4-amino-2'-hydroxybenzophenone, 4-dimethylamino-2'-hydroxybenzophenone, 4-diethylamino-2'-hydroxybenzophenone, 4-dimethylamino-4'-methoxy-2'-hydroxybenzophenone, 4-dimethylamino-2',4'-dihydroxybenzophenone, and 4-dimethylamino-3',4'-dihydroxybenzophenone.

In a case where the structure is present at the side chain of the polymer, a proportion occupied by the repeating unit containing the structure in the polymer is in a range in which light transmittance of the release layer 16 becomes 0.001 to 10%. When a polymer is prepared such that the proportion is within the range, the release layer 16 sufficiently absorbs light, and thus the polymer can be reliably and quickly changed in quality. That is, it is easy to remove the support plate 12 from the laminate 1, and it is possible to reduce a light irradiation time required for the removal.

The above structures can absorb light having a wavelength in the desired range by selection of the type. For example, the wavelength of light that can be absorbed by the structure is preferably 100 nm to 2,000 nm. In the range, the wavelength of light that can be absorbed by the structure is close to short wavelength, and for example, the wavelength is 100 nm to 500 nm. For example, preferably, by absorbing ultraviolet rays having a wavelength of about 300 nm to 370 nm, the structure can change a polymer containing the structure in quality.

Examples of the light that can be absorbed by the structure are lights emitted from a high-pressure mercury lamp (wavelength: 254 nm to 436 nm), a KrF excimer laser (wavelength: 248 nm), an ArF excimer laser (wavelength: 193 nm), an $F_2$ excimer laser (wavelength: 157 nm), a XeCl laser (308 nm), a XeF laser (wavelength: 351 nm) or a solid-state UV laser (wavelength: 355 nm), or a g-line (wavelength: 436 nm), a h-line (wavelength: 405 nm) or an i-line (wavelength: 365 nm).

The release layer 16 contains a polymer including the structure as a repeating unit, and the release layer 16 can further contain components other than the polymer. Examples of the components include a filler, a plasticizer, and components that can improve the release properties of the support plate 12. These components are suitably selected from substances or materials known in the related art which do not inhibit absorption of light by the structure, and not inhibit or promote change of the polymer in quality.

<Inorganic Substance>

The release layer 16 may be formed of an inorganic substance. By being constituted with an inorganic substance, the release layer 16 is changed in quality by absorbing light, and as a result, the release layer loses the strength or the adhesiveness before being irradiated with light. Therefore, by applying a slight external force (for example, lifting the support plate 12), the release layer 16 is broken, and thus it is possible to easily separate the support plate 12 and the substrate 11.

The inorganic substance may be a constitution which is changed in quality by absorbing light. For example, an inorganic substance of one or more types selected from a group consisting of a metal, a metal compound and carbon can be suitably used. The metal compound refers to a compound containing a metal atom, and for example, the metal compound can be metal oxides, or metal nitrides. Examples of the inorganic substance include an inorganic substance of one or more types selected from a group consisting of gold, silver, copper, iron, nickel, aluminum, titanium, chromium, $SiO_2$, SiN, $Si_3N_4$, TiN, and carbon, but the inorganic substance is not limited thereto. Moreover, the carbon can also include allotrope of carbon, and examples of the carbon include a diamond, fullerene, diamond-like carbon, a carbon nanotube.

The inorganic substance absorbs light having a wavelength in the specific range depending on the type. By irradiating the release layer with light having a wavelength in the range that the inorganic substance used in the release layer 16 absorbs, the inorganic substance may be suitably changed in quality.

As the light with which the release layer 16 formed of inorganic substances is irradiated, laser lights such as solid-state lasers including a YAG laser, a ruby laser, a glass laser, a $YVO_4$ laser, an LD laser, a fiber laser, and the like, liquid lasers including a dye laser and the like, gas lasers including a $CO_2$ laser, an excimer laser, an Ar laser, a He—Ne laser, and the like, a semiconductor laser and a free electron laser, or non-laser lights may be used as appropriate in accordance with the wavelength which can be absorbed by the inorganic substances.

The release layer 16 formed of the inorganic substance can be formed on the support plate 12, for example, by known techniques such as sputtering, chemical vapor deposition (CVD), plating, plasma CVD, spin coating. The thickness of the release layer 16 formed of an inorganic substance is not particularly limited, and it may be a thickness that can sufficiently absorb the light to be used. For example, a film thickness of 0.05 μm to 10 μm is more preferable. In addition, after both sides or one side of an inorganic film (for example, a metal film) formed of an inorganic substance constituting the release layer 16 is coated with an adhesive in advance, adhesion may be performed to the support plate 12 and the substrate 11.

In a case where a metal film is used as a release layer 16, reflection of the laser or charging to the film may occur depending on the conditions such as the film quality of the release layer 16, a type of a laser source, and a laser output. For this reason, it is preferable to take countermeasures for these problems by providing an antireflection film or an antistatic film on and beneath or any one side of the release layer 16.

<Compound Having Structure of Infrared Ray Absorption>

The release layer 16 may be formed of a compound having a structure of infrared ray absorption. The compound changes in quality by absorbing the infrared rays. As a result of change of the compound in quality, the release layer 16 loses the strength or the adhesiveness before being irradiated with infrared rays. Therefore, by applying a slight external force (for example, lifting the support plate), the release layer 16 is broken, and thus it is possible to easily separate the support plate 12 and the substrate 11.

Examples of the compounds including a structure having infrared ray absorptivity and a structure having infrared ray absorptivity include alkane, alkane (vinyl, trans, cis, vinylidene, trisubstituted, tetrasubstituted, conjugate, cumulene, cyclic), alkyne (monosubstituted, disubstituted), a monocyclic aromatic group (benzene, monosubstituted, disubstituted, trisubstituted), alcohols and phenols (free OH, an intramolecular hydrogen bond, an intermolecular hydrogen bond, saturated secondary, saturated tertiary, unsaturated secondary, unsaturated tertiary), acetal, ketal, aliphatic ether, aromatic ether, vinyl ether, oxirane ring ether, ether peroxide, ketone, dialkyl carbonyl, aromatic carbonyl, enol of 1,3-diketone, o-hydroxy aryl ketone, dialkyl aldehyde, aromatic aldehyde, carboxylic acid (dimer, carboxylate anion), formic ester, acetic ester, conjugated ester, non-conjugated ester, aromatic ester, lactone (β-, γ-, δ-), aliphatic acid chloride, aromatic acid chloride, acid anhydride (conjugated, non-conjugated, cyclic, acyclic), primary amide, secondary amide, lactam, primary amine (aliphatic, aromatic), secondary amine (aliphatic, aromatic), tertiary amine (aliphatic, aromatic), primary amine salt, secondary amine salt, tertiary amine salt, ammonium ion, aliphatic nitrile, aromatic nitrile, carbodiimide, aliphatic isonitrile, aromatic isonitrile, isocyanic ester, thiocyanic ester, aliphatic isothiocyanic ester, aromatic isothiocyanic ester, an aliphatic nitro compound, an aromatic nitro compound, nitroamine, nitrosoamine, nitric ester, nitrite ester, a nitroso bond (aliphatic, aromatic, monomer, dimer), sulfur compounds such as mercaptan, thiophenol, and thiol acid, a thiocarbonyl group, sulfoxide, sulfone, sulfonyl chloride, primary sulfonamide, secondary sulfonamide, sulfuric ester, a carbon-halogen bond, a Si-$A^1$ bond ($A^1$ is H, C, O or a halogen), a P-$A^2$ bond ($A^2$ is H, C or O) or a Ti—O bond).

Examples of the structure including the carbon-halogen bond described above include —$CH_2Cl$, —$CH_2Br$, —$CH_2I$, —$CF_2$—, —$CF_3$, —$CH=CF_2$, —$CF=CF_2$, aryl fluoride, and aryl chloride.

Examples of the structure including the Si-$A^1$ bond described above include SiH, $SiH_2$, $SiH_3$, Si—$CH_3$, Si—$CH_2$—, Si—$C_6H_5$, a SiO aliphatic group, Si—$OCH_3$, Si—$OCH_2CH_3$, Si—$OC_6H_5$, Si—O—Si, Si—OH, SiF, $SiF_2$, and $SiF_3$. As the structure including the Si-$A^1$ bond, in particular, a structure in which a siloxane skeleton and a silsesquioxane skeleton are formed is preferable.

Examples of the structure including the P-$A^2$ bond described above include PH, $PH_2$, P—$CH_3$, P—$CH_2$—, P—$C_6H_5$, $A^3{}_3$-P—O ($A^3$ represents an aliphatic group or an aromatic group), ($A^4$O)$_3$—P—O ($A^4$ represents alkyl), P—$OCH_3$, P—$OCH_2CH_3$, P—$OC_6H_5$, P—O—P, P—OH, and O=P—OH.

The above-described structures can absorb infrared rays having a wavelength in the desired range by selection of the type. For example, the wavelength of infrared rays that can be absorbed by the structure is in the range of 1 µm to 20 µm, and the structure can more preferably absorb the wavelength in the range of 2 µm to 15 µm. Furthermore, in a case where the structure is a Si—O bond, a Si—C bond and a Ti—O bond, the wavelength can be in the range of 9 µm to 11 µm. Moreover, those skilled in the art can easily understand the wavelength of infrared rays that can be absorbed by each structure. For example, as an absorption band in each structure, pp. 146 to 151 of non-patent literature: "Spectrometric identification of organic compounds—combined use of MS, IR, NMR, UV—(5th edition)", written by Siverstein, Bassler and Morrill (published in 1992) can be referred to.

The compound having a structure of infrared ray absorption used in the formation of the release layer 16 is not particularly limited as long as it has a structure as described above, can be dissolved in a solvent to be coated, and can form a solid layer which is solidified. However, in order to easily separate the support plate 12 and the substrate 11 by effectively changing the compound in the release layer 16 in quality, it is preferable that absorption of infrared rays in the release layer 16 be great, that is, the transmittance of infrared rays when the release layer 16 is irradiated with the infrared rays be low. Specifically, the transmittance of infrared rays in the release layer 16 is preferably less than 90%, and the transmittance of infrared rays is more preferably less than 80%.

For example, as the compound having a siloxane skeleton, a resin which is a copolymer having a repeating unit represented by the following formula (2) and a repeating unit represented by the following formula (1), or a resin which is a copolymer having a repeating unit represented by the following formula (1) and a repeating unit derived from acrylic compound can be used.

[Chemical formula 3]

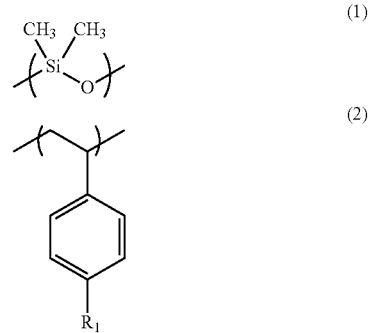

In the formula (2), $R_1$ represents a hydrogen atom, an alkyl group having 10 carbon atoms or less, or an alkoxy group having 10 carbon atoms or less.

Among these, as the compound having a siloxane skeleton, tert-butylstyrene (TBST)-dimethylsiloxane copolymer which is a copolymer having a repeating unit represented by the above formula (1) and a repeating unit represented by the following formula (3) is more preferable, and TBST-dimethylsiloxane copolymer which includes a repeating unit represented by the above formula (1) and a repeating unit represented by the following formula (3) at a ratio of 1:1 is even more preferable.

[Chemical formula 4]

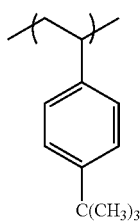

(3)

In addition, as the compound having a silsesquioxane skeleton, for example, a resin which is a copolymer having a repeating unit represented by the following formula (4) and a repeating unit represented by the following formula (5) can be used.

[Chemical formula 5]

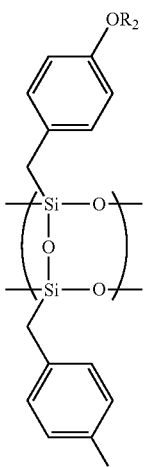

(4)

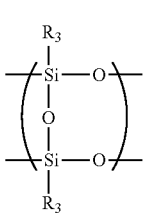

(5)

In the formula (4), $R_2$ represents a hydrogen atom or an alkyl group having 1 carbon atom to 10 carbon atoms, in the formula (5), $R_3$ represents an alkyl group having 1 carbon atom to 10 carbon atoms, or a phenyl group.

In addition to the above compounds, as the compound having the silsesquioxane skeleton, each silsesquioxane resin disclosed in PTL 3: JP-A-2007-258663 (published on Oct. 4, 2007), PTL 4: JP-A-2010-120901 (published on Jun. 3, 2010), PTL 5: JP-A-2009-263316 (published on Nov. 12, 2009), and PTL 6: JP-A-2009-263596 (published on Nov. 12, 2009) can be suitably used.

Among these, as the compound having the silsesquioxane skeleton, a copolymer having a repeating unit represented by the following formula (6) and a repeating unit represented by the following formula (7) is more preferable, and a copolymer which includes a repeating unit represented by the following formula (6) and a repeating unit represented by the following formula (7) at a ratio of 7:3 is even more preferable.

[Chemical formula 6]

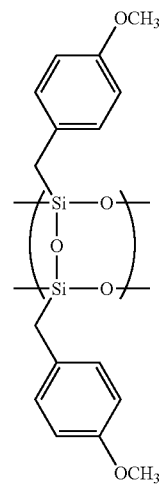

(6)

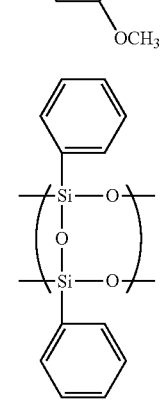

(7)

A polymer having the silsesquioxane skeleton can have a random structure, a ladder structure, and a cage structure, and may have any of these structures.

In addition, examples of the compound containing a Ti—O bond include (i) alkoxy titanium such as tetra-i-propoxy titanium, tetra-n-butoxy titanium, tetrakis(2-ethylhexyloxy)titanium and titanium-i-propoxy octylene glycolate, (ii) chelate titanium such as di-i-propoxy bis (acetylacetonato)titanium and propanedioxy titanium bis (ethyl acetoacetate), (iii) titanium polymers such as i-$C_3H_7O$—[—Ti(O-i-$C_3H_7)_2$—O-]$_n$-i-$C_3H_7$ and n-$C_4H_9O$—[—Ti(O-n-$C_4H_9)_2$—O-]$_n$-n-$C_4H_9$, (iv) titanium acylates such as tri-n-butoxy titanium monostearate, titanium stearate, di-i-propoxy titanium diisostearate and (2-n-butoxycarbonyl benzoyloxy)tributoxy titanium, and (v) water-soluble titanium compounds such as di-n-butoxy bis(triethanolaminato)titanium.

Among these, as the compound containing a Ti—O bond, di-n-butoxy-bis(triethanolaminato)titanium (Ti(O$C_4H_9)_2$[O$C_2H_4$N($C_2H_4$OH)$_2$]$_2$) is preferable.

The above-described release layer 16 includes a compound having a structure of infrared ray absorption, and the release layer 16 can further contain components other than the above-described compounds. Examples of the components include a filler, a plasticizer, and components that can improve the release properties of the support plate 12. These components are suitably selected from substances or materials known in the related art which do not inhibit absorption of infrared rays by the structure, and not inhibit or promote change of compounds in quality.

<Fluorocarbon>

The release layer 16 may be formed of fluorocarbon. By being constituted by the fluorocarbon, the release layer 16 is changed in quality by absorbing light, and as a result, the release layer loses strength or adhesiveness before being irradiated with light. Therefore, by applying a slight external force (for example, lifting the support plate 12), the release layer 16 is broken, and thus it is possible to easily separate the support plate 12 and the substrate 11.

In addition, from one viewpoint, fluorocarbon constituting the release layer 16 can be suitably film-formed by a plasma CVD method. Moreover, the fluorocarbon includes $C_xF_y$ (perfluorocarbon) and $C_xH_yF_z$ (x, y, and z are integers). Examples of the fluorocarbon include, but not limited to, $CHF_3$, $CH_2F_2$, $C_2H_2F_2$, $C_4F_8$, $C_2F_6$, and $C_5F_8$. In addition, inert gases such as nitrogen, helium or argon, oxygen, hydrocarbons such as an alkane and an alkene, carbon dioxide, and hydrogen may be added to the fluorocarbon used to constitute a release layer 16, as necessary. In addition, these gases may be used in a mixture of plural gases (such as mixed gas of fluorocarbon, hydrogen, or nitrogen). In addition, the release layer 16 may be constituted by single type of fluorocarbon, or the release layer may be constituted by two or more types of fluorocarbons.

The fluorocarbon absorbs light having a wavelength in the specific range depending on the type. By irradiating the release layer 16 with light having wavelength in the range that fluorocarbon used in the release layer 16 absorbs, fluorocarbon is suitably changed in quality. The absorptivity of light in the release layer 16 is preferably 80% or more.

As the light with which the release layer 16 is irradiated, laser lights such as solid-state lasers including a YAG laser, ruby laser, a glass laser, a $YVO_4$ laser, an LD laser, a fiber laser and the like, liquid lasers including a dye laser and the like, gas lasers including a $CO_2$ laser, an excimer laser, an Ar laser, a He—Ne laser and the like, a semiconductor laser and a free electron laser, or non-laser lights may be used as appropriate in accordance with the wavelength which can be absorbed by fluorocarbon. As the wavelength that can change fluorocarbon in quality, for example, a wavelength in the range of 600 nm or less can be used, but the wavelength is not limited thereto.

<Infrared Ray Absorbing Substance>

The release layer 16 may contain an infrared ray absorbing substance. By being constituted so as to contain the infrared ray absorbing substance, the release layer 16 is changed in quality by absorbing light, and as a result, the release layer loses strength or adhesiveness before being irradiated with light. Therefore, by applying a slight external force (for example, lifting the support plate 12), the release layer 16 is broken, and thus it is possible to easily separate the support plate 12 and the substrate 11.

The infrared ray absorbing substance may be a constitution which is changed in quality by absorbing infrared rays. For example, carbon black, iron particles or aluminum particles can be suitably used. The infrared ray absorbing substance absorbs light having a wavelength in the specific range depending on the type. By irradiating the release layer 16 with light having a wavelength in the range that the infrared ray absorbing substance used in the release layer 16 absorbs, the infrared ray absorbing substance can be suitably changed in quality.

(Adhesive Layer 14)

The adhesive layer 14 is configured to attach and fix the substrate 11 to the support plate 12, and cover the surface of the substrate 11 for protection. Therefore, when processing or transferring the substrate 11, it is necessary that the adhesive layer has adhesiveness and strength to fix the substrate 11 with respect to the support plate 12 and to maintain the coating on the surface of the substrate 11 to be protected. On the other hand, when fixing of the substrate 11 with respect to the support plate 12 is no longer needed, it is necessary that the adhesive layer can be easily peeled off or removed from the substrate 11.

Therefore, the adhesive layer 14 is constituted with an adhesive which usually has strong adhesiveness and of which the adhesiveness is decreased by some processing, or which has solubility with respect to specific solvents. For example, the thickness of the adhesive layer 14 is preferably 1 µm to 200 µm, and more preferably 10 µm to 150 µm. The adhesive layer 14 can be formed by coating adhesive materials as shown below on the substrate 11 by a method known in the related art such as a spin coating.

As the adhesive, for example, various adhesives known in the related art such as an acrylic-based adhesive, a novolac-based adhesive, a naphthoquinone-based adhesives, a hydrocarbon-based adhesive, and a polyimide-based adhesive can be used as an adhesive constituting the adhesive layer 14 according to the present invention. Hereinafter, a composition of a resin which is contained in the adhesive layer 14 in the present embodiment will be described.

The resin contained in the adhesive layer 14 is not limited as long as the resin has adhesiveness, and examples of the resin include a hydrocarbon resin, an acrylic-styrene-based resin, a maleimide-based resin, or combinations of these.

<Hydrocarbon Resin>

A hydrocarbon resin is a resin having a hydrocarbon skeleton and formed by polymerizing a monomer composition. Example of the hydrocarbon resin include a cycloolefin-based polymer (hereinafter, also referred to as a "resin (A)") and at least one resin (hereinafter, also referred to as a "resin (B)") selected from the group consisting of a terpene resin, a rosin-based resin, and a petroleum resin, but not limited thereto.

The resin (A) may be a resin formed by polymerizing monomer components including cycloolefin-based monomers. Specifically, a ring-opening (co)polymer of monomer components including cycloolefin-based monomers and a resin obtained by addition-(co)polymerizing monomer components including cycloolefin-based monomers are exemplified.

Examples of the cycloolefin-based monomers included in monomer components constituting the resin (A) include bicyclic compounds such as norbornene, norbornadiene, or the like, tricyclic compounds such as dicyclopentadiene, dihydroxypentadiene, or the like, tetracyclic compounds such as tetracyclododecene or the like, pentacyclic compounds such as cyclopentadiene trimer or the like, heptacyclic compounds such as tetracyclopentadiene or the like, alkyl- (methyl-, ethyl-, propyl-, butyl-, or the like) substituted derivatives of these, alkenyl- (vinyl- or the like) substituted derivatives of these, alkylidene-(ethylidene- or the like) substituted derivatives of these, aryl- (phenyl-, tolyl-, naphthyl, or the like) substituted derivatives of these, or the like. Among them, in particular, norbornene, tetracyclododecene, or a norbornene-based monomer selected from a group consisting of alkyl-substituted derivatives thereof is preferable.

The monomer components constituting the resin (A) may contain other monomers copolymerizable with the cycloolefin-based monomers, and for example, alkene monomers are preferably contained. As the alkene monomers, α-olefins such as ethylene, propylene, 1-butene, isobutene, 1-hexene, and the like are exemplified. The alkene monomer may be linear or branched.

In addition, as the monomer components constituting the resin (A), cycloolefin monomer is preferably contained from the viewpoint of high heat resistance (low thermal decomposition and thermal weight reduction property). The ratio of the cycloolefin monomer with respect to the entire monomer components constituting the resin (A) is preferably 5 mol % or greater, more preferably 10 mole % or greater, and further more preferably 20 mol % or greater. In addition, the ratio of the cycloolefin monomer with respect to the entire monomer components constituting the resin (A), which is not particularly limited, is preferably 80 mol % or less, and more preferably 70 mol % or less from the viewpoint of solubility and exposure stability.

In addition, the monomer components constituting the resin (A) may contain linear or branched alkene monomers. The ratio of the alkene monomers with respect to the entire monomer components constituting the resin (A) is preferably 10 mol % to 90 mol %, more preferably 20 mol % to 85 mol %, and further more preferably 30 mol % to 80 mol % from the viewpoint of solubility and flexibility.

Moreover, it is preferable that the resin (A), for example, as a resin formed by polymerizing monomer components consisting of cycloolefin-based monomers and alkene monomers, be a resin having no polar group to suppress the generation of gas at high temperature.

The polymerization method and the polymerization conditions when the monomer components are polymerized are not particularly limited, and may be suitably set according to common methods.

Examples of commercially available products that can be used as a resin (A) include "TOPAS" manufactured by POLYPLASTICS Co., Ltd, "APEL" manufactured by Mitsui Chemicals, Inc., "ZEONOR" and "ZEONEX" manufactured by ZEON CORPORATION, and "ARTON" manufactured by JSR Corporation.

A glass transition temperature (Tg) of the resin (A) is preferably 60° C. or higher, and particularly preferably 70° C. or higher. In a case where the glass transition temperature of the resin (A) is 60° C. or higher, when the adhesive laminate is exposed to a high temperature environment, it is possible to further suppress softening of the adhesive layer.

The resin (B) is at least one resin selected from a group consisting of a terpene-based resin, a rosin-based resin, and a petroleum-based resin. Specifically, examples of the terpene-based resin include a terpene resin, a terpene phenol resin, a modified terpene resin, a hydrogenated terpene resin, and a hydrogenated terpene phenol resin. Examples of the rosin-based resin include rosin, a rosin ester, hydrogenated rosin, a hydrogenated rosin ester, polymerized rosin, a polymerized rosin ester, and modified rosin. Examples of the petroleum-based resin include an aliphatic or aromatic petroleum resin, a hydrogenated petroleum resin, a denatured petroleum resin, an alicyclic petroleum resin, and a coumarone-indene petroleum resin. Among these, a hydrogenated terpene resin and a hydrogenated petroleum resin are preferable.

A softening point of the resin (B), which is not particularly limited, is preferably 80° C. to 160° C. In a case where the softening point of the resin (B) is 80° C. or higher, when the adhesive laminate is exposed to a high temperature environment, it is possible to suppress softening, and an adhesive failure does not occur. On the other hands, in a case where the softening point of the resin (B) is 160° C. or lower, when the adhesive laminate is peeled off, the peeling rate becomes excellent.

A molecular weight of the resin (B), which is not particularly limited, is preferably 300 to 3000. When the molecular weight of the resin (B) is 300 or greater, heat resistance becomes sufficient, the amount of degasification is reduced under a high temperature environment. On the other hands, in a case where the molecular weight of the resin (B) is 3000 or smaller, when the adhesive laminate is peeled off, the peeling rate becomes excellent. Moreover, the molecular weight of the resin (B) in the exemplary embodiment means a molecular weight in terms of polystyrene measured using a gel permeation chromatography (GPC).

Moreover, as the resin, a mixture of the resins (A) and (B) may be used. By mixing, the heat resistance and the peeling rate become excellent. For example, the mixing ratio between the resin (A) and the resin (B) is preferably (A):(B)=80:20 to 55:45 (mass ratio) since the peeling rate, the heat resistance under the high temperature environment, and flexibility is excellent at this ratio.

<Acrylic-Styrene-Based Resin>

Examples of the acrylic-styrene-based resin include resins which are polymerized using styrene or styrene derivatives, and (meth)acrylic acid esters as a monomer.

Examples of the (meth)acrylic acid ester include (meth)acrylic acid alkyl ester formed of a chain structure, (meth)acrylic acid ester having an aliphatic ring, and (meth)acrylic acid ester having an aromatic ring. Examples of the (meth)acrylic acid alkyl ester formed of a chain structure include acrylic-based long chain alkyl ester having an alkyl group with 15 to 20 carbon atoms, and acrylic-based alkyl ester having an alkyl group with 1 to 14 carbon atoms. Examples of the acrylic-based long chain alkyl ester include alkyl esters of an acrylic acid or a methacrylic acid in which the alkyl group is an n-pentadecyl group, an n-hexadecyl group, an n-heptadecyl group, an n-octadecyl group, an n-nonadecyl group, or an n-eicosyl group. Moreover, the alkyl group may be branched.

Examples of the acrylic-based alkyl ester having an alkyl group with 1 to 14 carbon atoms include known acrylic-based alkyl ester used in an existing acrylic-based adhesive. For example, alkyl esters of an acrylic acid or a methacrylic acid in which the alkyl group is a methyl group, an ethyl group, a propyl group, a butyl group, a 2-ethylhexyl group, an isooctyl group, an isononyl group, an isodecyl group, a dodecyl group, a lauryl group, and a tridecyl group are exemplified.

Examples of the (meth)acrylic ester having an aliphatic ring include cyclohexyl (meth)acrylate, cyclopentyl (meth)acrylate, 1-adamantyl (meth)acrylate, norbornyl (meth)acrylate, isobornyl (meth)acrylate, tricyclodecanyl (meth)acrylate, tetracyclododecanyl (meth)acrylate, and dicyclopentanyl (meth)acrylate, and isobornyl methacrylate and dicyclopentanyl (meth)acrylate are more preferable.

The (meth)acrylic acid ester having an aromatic ring is not particularly limited, and examples of the aromatic ring include a phenyl group, a benzyl group, a tolyl group, a xylyl group, a biphenyl group, a naphthyl group, an anthracenyl group, a phenoxymethyl group, and a phenoxyethyl group. In addition, the aromatic ring may have a linear or a branched alkyl group having 1 to 5 carbon atoms. Specifically, phenoxyethylacrylate is preferable.

<Maleimide-Based Resin>

Examples of the maleimide-based resin include resins obtained by polymerizing, as a monomer, maleimides having an alkyl group such as N-methyl maleimide, N-ethyl maleimide, N-n-propyl maleimide, N-isopropyl maleimide, N-n-butyl maleimide, N-isobutyl maleimide, N-sec-butyl maleimide, N-tert-butyl maleimide, N-n-pentyl maleimide, N-n-hexyl maleimide, N-n-heptyl maleimide, N-n-octyl maleimide, N-lauryl maleimide, or N-stearyl maleimide, maleimides having an aliphatic hydrocarbon group such as N-cyclopropyl maleimide, N-cyclobutyl maleimide, N-cyclopentyl maleimide, N-cyclohexyl maleimide, N-cycloheptyl maleimide, or N-cyclooctyl maleimide, and aromatic maleimides having an aryl group such as N-phenyl maleimide, N-m-methylphenyl maleimide, N-o-methylphenyl maleimide, or N-p-methylphenyl maleimide.

For example, it is possible to use a cycloolefin copolymer which is a copolymer having a repeating unit represented by the following formula (8) and a repeating unit represented by the following formula (9), as a resin of an adhesive component.

[Chemical formula 7]

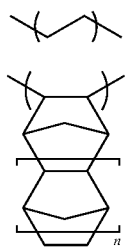

(8)

(9)

In the formula (9), n represents 0 or an integer of 1 to 3.

Moreover, as the cycloolefin copolymer, APL 8008T, APL 8009T, and APL 6013T (all manufactured by Mitsui Chemicals, Inc.) can be used.

Moreover, the adhesive layer 14 is preferably formed using a resin other than a photocurable resin (for example, a UV curable resin). This is because that there may be a case where the photocurable resin remains around minute irregularities of the substrate 11 as a residue after peeling off or removing the adhesive layer 14. In particular, an adhesive which is soluble in a specific solvent is preferable as a material constituting the adhesive layer 14. This is because the adhesive layer 14 can be removed by being dissolved in the solvent without applying physical force to the substrate 11. When removing the adhesive layer 14, it is possible to easily remove the adhesive layer 14 without damage or deformation of the substrate 11 even from the substrate 11 of which the strength is reduced.

Examples of the diluent solvent at the time of forming a release layer or an adhesive layer include linear hydrocarbons such as hexane, heptane, octane, nonane, methyloctane, decane, undecane, dodecane and tridecane, branched hydrocarbons having 3 to 15 carbon atoms, terpene-based solvents such as p-mentane, o-mentane, m-mentane, diphenyl mentane, 1,4-terpine, 1,8-terpine, bornane, norbornane, pinane, thujane, carane, longifolene, geraniol, nerol, linalool, citral, citronellol, menthol, isomenthol, neomenthol, α-terpineol, β-terpineol, γ-terpineol, terpinene-1-ol, terpinene-4-ol, dihydroterpinylacetate, 1,4-cineol, 1,8-cineol, borneol, carvone, ionone, thujone, camphor, d-limonene, 1-limonene, and dipentene; lactones such as γ-butyrolactone and the like; ketones such as acetone, methylethylketone, cyclohexanone (CH), methyl-n-pentylketone, methylisopentylketone, and 2-heptanone; polyols such as ethyleneglycol, diethyleneglycol, propyleneglycol, and dipropyleneglycol; compounds having a ester bond such as ethyleneglycol monoacetate, diethyleneglycol monoacetate, propyleneglycol monoacetate, and dipropyleneglycol monoacetate, a derivative of a polyol such as compounds having an ether bond, such as monoalkyl ether, such as monomethyl ether, monoethyl ether, monopropyl ether, monobutyl ether, or monophenyl ether of the polyols or the compound having the ester bond (among them, propyleneglycol monomethyl ether acetate (PGMEA), propyleneglycol monomethyl ether (PGME) are preferable); cyclic ethers such as dioxane, esters such as methyl lactate, ethyl lactate (EL), methyl acetate, ethyl acetate, butyl acetate, methoxybutyl acetate, methyl pyruvate, ethyl pyruvate, methyl methoxypropionate, and ethyl ethoxypropionate; and aromatic-based organic solvents such as anisole, ethylbenzyl ether, cresylmethyl ether, diphenyl ether, dibenzyl ether, phenetol, and butylphenyl ether.

<Other Components>

The adhesive material may further include another miscible substance in such a range that no essential feature of the invention is impaired. For example, the adhesive composition can further include commonly used various additives for improving performance of an adhesive, such as an additive resin, a plasticizer, an adhesion auxiliary substance, a stabilizer, a colorant, an antioxidant, a surfactant, and the like.

(Irradiation Step)

In the supporting member separation method, first, as shown in (1) of FIG. 1, laser light is irradiated to the laminate 1 from the support plate 12 side of the laminate 1 (Irradiation step). At this time, the irradiated laser light reaches the release layer 16 through the support plate 12 having light transmittance. The release layer 16 which absorbed the reached laser light, is changed in quality as shown in (2) of FIG. 1. Thus, adhesion between the substrate 11 and the support plate 12 weakens, and as shown in (3) of FIG. 1, the support plate 12 is easily separated from the substrate 11.

When laser light is irradiated from the support plate 12 side to separate the support plate 12 from the laminate 1, the laser light leaks from the release layer 16 in some cases. In particular, in a case where light of the irradiation amount more than the irradiation amount necessary to change the release layer 16 in quality is irradiated, there is a possibility that a part of the irradiated light is not absorbed in the release layer 16, and leaks from the release layer 16.

For this reason, there is a possibility that the leaked light reaches the substrate 11, and thus, the substrate 11 itself or electronic elements such as an electronic circuit to be protected, formed on the substrate 11 is adversely affected by the leaked light. As the adverse effects by the leaked light, degradation of the electronic circuit mounted on the substrate 11, damage of the substrate 11, and the like are exemplified.

As a result of extensive studies on damage on the substrate 11 and the electronic elements formed on the substrate 11 by light which is irradiated to the release layer 16 to avoid this problem, the present inventors have found that the pulse width of the laser light irradiated to the release layer 16 largely affects the damage on the substrate 11 and the electronic elements formed on the substrate 11.

In the supporting member separation method, irradiation of laser light which is pulse-oscillated with a pulse having a pulse width of 20 ns or greater is performed to the release layer 16 in the irradiation step. Therefore, even when light leaked without being absorbed in the release layer 16 reaches the substrate 11, the light does not damage the substrate 11 and the electronic elements formed on the substrate 11. On the other hand, since laser light having sufficient energy for separating the release layer 16 is irradiated to the release layer 16, the substrate 11 and the support plate 12 can be easily separated.

In general, in a case where total energy (pulse energy) of laser light is set to be constant, as the pulse width becomes shorter, the laser intensity is increased, and as the pulse width becomes greater, the laser intensity is decreased. For this reason, in a case where laser light with a short pulse width is irradiated to the release layer 16 through the support plate 12, laser light with a high intensity is irradiated to the release layer 16. As a result, the laser intensity of light leaked without being absorbed in the release layer 16 is also increased, and in a case where the leakage light reaches the substrate 11 and the electronic elements formed on the substrate 11, the light largely damages the substrate 11 and the electronic elements formed on the substrate 11.

In the supporting member separation method, since irradiation of laser light which is pulse-oscillated with a pulse having a pulse width of 20 ns or greater is performed to the release layer 16, even when leakage light from the release layer 16 reaches the substrate 11, the laser intensity is not high enough to damage the substrate 11 and the electronic elements formed on the substrate 11. That is, the leakage light does not damage the substrate 11 and the electronic elements formed on the substrate 11.

In the supporting member separation method, generally, the pulse-oscillated laser light is also referred to as pulse light, and is emitted from the pulse laser oscillator (irradiation means). The pulse width of the pulse light irradiated to the release layer 16 is more preferably 40 ns or greater, and further more preferably 70 ns or greater. Therefore, it is possible to further suppress adverse effects on the substrate 11 and the electronic elements formed on the substrate 11 by light leaked without being absorbed in the release layer 16.

It is sufficient that the pulse light which is irradiated to the release layer 16 has a pulse width of 20 ns or greater, and has the laser intensity at which the substrate 11 and the support plate 12 can be separated by changing the release layer 16 in quality. The upper limit value of the pulse width of the pulse light irradiated to the release layer 16, which varies depending on the laser intensity required for changing the release layer 16 in quality, is preferably 200 ns, and more preferably 150 ns. In addition, the laser intensity required for changing the release layer 16 in quality varies depending on the material which forms the release layer 16, the thickness of the release layer 16, and the like.

As pulse energy is increased, the laser intensity of the pulse light is increased, and as pulse energy is decreased, the laser intensity of the pulse light is decreased. Therefore, the pulse energy of the pulse light irradiated to the release layer 16, which varies depending on the laser intensity required for changing the release layer 16 in quality, is preferably 0.1 W or greater and 10 W or less, and more preferably 0.5 W or greater and 6 W or less.

As the beam spot diameter of the pulse light is decreased, the laser intensity of the pulse light is increased, and as the beam spot diameter of the pulse light is increased, the laser intensity of the pulse light is decreased. Therefore, the beam spot diameter of the pulse light irradiated to the release layer 16, which varies depending on the laser intensity required for changing the release layer 16 in quality, is preferably 100 μm or greater and 250 μm or less, and more preferably 120 μm or greater and 200 μm or less.

The irradiation pitch of the pulse light may be a pitch at which adjacent beam spots are not overlapped and the release layer 16 can be changed in quality, and is preferably 110 μm or greater and 250 μm or less, and more preferably 160 μm or greater and 220 μm or less.

The irradiation rate of the pulse light may be a speed at which the release layer 16 can be changed in quality, and is preferably 4000 mm/s or greater and 10000 mm/s or less, and more preferably 5000 mm/s or greater and 8000 mm/s or less.

The frequency of the pulse light is not particularly limited as long as the release layer 16 can be changed in quality at the frequency, and is preferably 20 kHz or greater and 100 kHz or less, and more preferably 20 kHz or greater and 60 kHz or less.

The defocus of the pulse light may be a range in which the beam spot diameter can be adjusted to the above described range, and is preferably 0 mm or greater and 10 mm or less, and more preferably 0 mm or greater and 5 mm or less.

The wavelength of the pulse light is not particularly limited as long as the release layer 16 can be changed in quality at the wavelength, and is preferably 380 nm or greater and 1064 nm or less, and more preferably 495 nm or greater and 570 nm or less. The preferable range of the wavelength of the pulse light irradiated to the release layer 16 is a range of a wavelength which the release layer 16 can absorbs, and therefore varies depending on the material which forms the release layer 16.

In the supporting member separation method, an irradiation apparatus which irradiates pulse light is not particularly limited as long as it can irradiate the pulse light having a pulse width of 20 ns or greater to the release layer 16, and an oscillator suitably selected from solid-state laser oscillators such as a YAG laser, a ruby laser, a glass laser, a $YVO_4$ laser, an LD laser, a fiber laser, and the like, liquid laser oscillators such as a dye laser, and the like, gas laser oscillators such as a $CO_2$ laser, an excimer laser, an Ar laser, a He—Ne laser, and the like, a semiconductor laser oscillator, and a free electron laser oscillator can be used. The irradiation apparatus can be suitably selected depending on materials constituting the release layer 16, and a laser that irradiates light capable of changing materials constituting the release layer 16 in quality may be selected.

In the irradiation step, it is preferable that the pulse light be uniformly irradiated throughout the laminate 1, and if the release layer 16 can be changed in quality such that the substrate 11 and the support plate can be easily separated, the pulse light may be partially irradiated to the laminate 1.

According to the supporting member separation method, since irradiation of laser light which is pulse-oscillated with a pulse having a pulse width of 20 ns or greater is performed to the release layer 16, even when light leaked without being absorbed in the release layer 16 reaches the substrate 11, the light leaked does not damage the substrate 11 and the electronic elements formed on the substrate 11. In addition, since light having the energy intensity necessary for changing the release layer 16 in quality can be irradiated to the release layer 16, the substrate 11 and the support plate 12 can be easily separated.

That is, according to the supporting member separation method, the effects that during the manufacturing process, a strong attachment between the substrate 11 and the support plate 12 is realized, after the manufacturing process, the substrate 11 and the support plate 12 can be easily separated by irradiation with light, and the adverse effects on the substrate 11 by the light can be prevented are exhibited.

[Supporting Member Separation Apparatus]

The supporting member separation apparatus according to the present invention is a supporting member separation apparatus for separating a laminate formed by laminating a substrate, an adhesive layer, a release layer which is changed in quality by absorbing light, and a supporting member in this order, the apparatus including: an irradiation means in which irradiation of laser light which is pulse-oscillated with a pulse having a pulse width of 20 ns or greater is performed to the above release layer.

One embodiment of the irradiation means of the supporting member separation apparatus according to the present invention is an irradiation apparatus which irradiates laser light in the irradiation step of the supporting member separation method according to the present invention, and description of the supporting member separation apparatus according to the present invention is in accordance to the description of the supporting member separation method according to the present invention.

Hereinafter, examples will be described, and the embodiment of the present invention will be described in more detail. Obviously, the present invention is not limited to the examples, and details of the present invention can be varied in many ways. Further, the present invention is not limited to the embodiments above, but may be subjected to various modification within the scope of the claims. That is, an embodiment derived from a proper combination of technical means disclosed in different embodiments is included in the technical scope of the present invention. Also, the entire contents of documents cited herein are hereby incorporated by reference.

EXAMPLES

Using a laser irradiation apparatus which oscillates laser light having different pulse widths, the effect of the laser light on a substrate was examined.

(Production of Laminate)

A Cu plate (copper film, thickness: 1 μm) was attached to a wafer substrate (12-inch Si, thickness: 700 μm). Moreover, the Cu plate was used instead of elements to be mounted on the wafer substrate, electrical circuits, and the like. Next, TZNR-A3007t (manufactured by Tokyo Ohka Kogyo Co., LTD.) as an adhesive composition was baked at 100° C. for 3 minutes, 160° C. for 3 minutes, and 220° C. for minutes, respectively, whereby a adhesive layer (thickness: 50 μm) was formed.

Next, under the conditions of a flow rate of 400 sccm, a pressure of 700 mTorr, a high-frequency power of 2500 W and a film-forming temperature of 240° C., by a CVD method using $C_4F_8$ as a reaction gas, a fluorocarbon film (thickness: 1 μm) was formed on the supporting member (12-inch glass substrate, thickness: 700 μm), whereby a release layer was formed.

Next, by attaching the adhesive layer and the release layer, a laminate is formed in which the wafer substrate, the Cu plate, the adhesive layer, the release layer and a support plate are laminated in this order. In addition, a laminate was produced in the same manner using a Sn—Ag plate (tin-silver plate, thickness: 0.4 μm) instead of the Cu plate. Since the Sn—Ag plate is more likely to be influenced by light than the Cu plate, the Sn—Ag plate was used as an example of a material which is more likely to be influenced by light.

Laser light was irradiated to these laminates from the support plate side, and damage on the Cu plate or the Sn—Ag plate was visually confirmed using a microscope. In a case where beam spots of the laser light were formed on the Cu plate or the Sn—Ag plate, it was evaluated as a presence of damage, and in a case where beam spots of the laser light were not formed on the Cu plate or the Sn—Ag plate, it was evaluated as an absence of damage.

(Relationship Between Frequency and Pulse Width)

Figure 2:
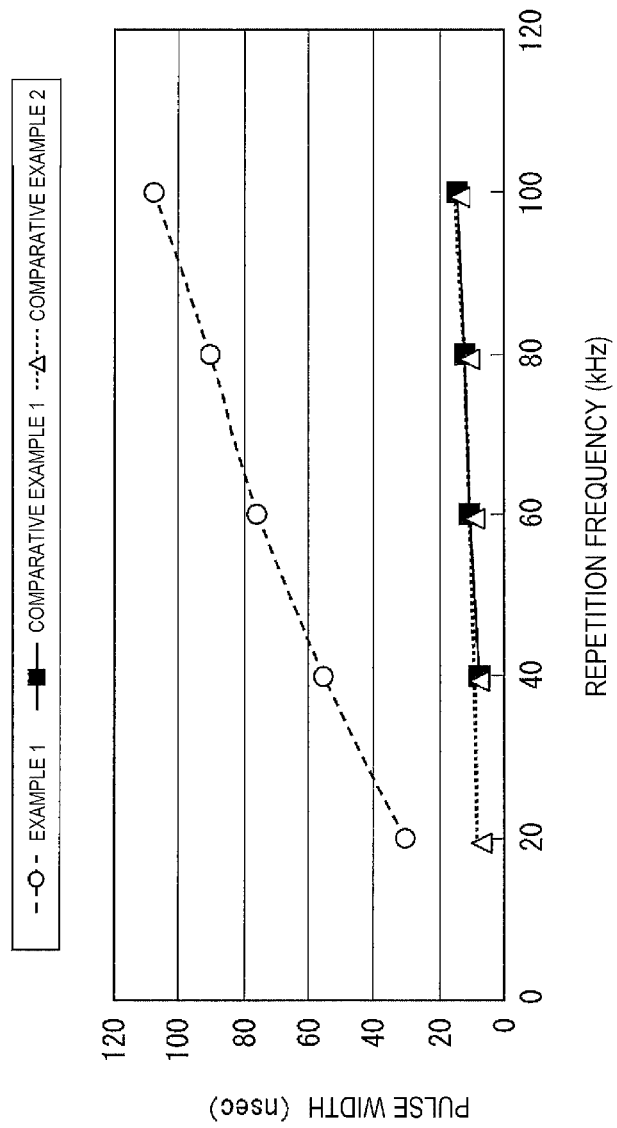
FIG. 2 is a graph showing a relationship between a pulse width of laser light and a repetition frequency.

In each irradiation apparatus (Example 1 and Comparative Examples 1 and 2), the frequency and the pulse width of the laser light were measured. The relationship between the frequency and the pulse width is shown in FIG. 2 and Table 1. FIG. 2 is a graph showing the relationship between the pulse width and the repetition frequency of laser light. In the irradiation apparatus in Example 1 and Comparative Example 2, at the irradiation work position, and in the irradiation apparatus in Comparative Example 1, at the position immediately after a laser emission, the laser light was detected by a pulse width measuring instrument (manufactured by Japan Laser Corp.), and the waveform and the pulse width thereof were displayed on an oscilloscope and measured. Moreover, in the irradiation apparatus in Comparative Example 1, the laser light having a frequency of 20 kHz was not detected.

TABLE 1

|  |  | Pulse width (ns) | | |
|---|---|---|---|---|
|  |  | Example 1 | Comparative Example 1 | Comparative Example 2 |
| Frequency | 20 kHz | 30.4 | — | 8.2 |
|  | 40 kHz | 55.5 | 7.8 | 8.9 |
|  | 60 kHz | 76.2 | 10.7 | 10.3 |
|  | 80 kHz | 90.5 | 12.5 | 12.4 |
|  | 100 kHz | 108.5 | 14.3 | 15.5 |

As shown in FIG. 2 and Table 1, in the irradiation apparatus in Example 1, the pulse width was 20 ns or greater at all frequencies, and in the irradiation apparatus in Comparative Examples 1 and 2, the pulse width was less than 20 ns at all frequencies.

Example 1

Next, using the irradiation apparatus in Example 1, the average power of each laser light having a frequency of 20 kHz, 60 kHz, and 100 kHz was changed to be 1.4 W, 1.6 W, and 1.8 W, respectively, and each laser light was irradiated to each laminate. At this time, the irradiation pitch of each laser light was set to 160 μm, the irradiation rate was set to 6000 mm/s, and the defocus was set to 5 mm.

As a result, in a case where the frequency was 60 kHz and 100 kHz, damage was not observed on the Sn—Ag plate, however, in a case where the frequency was 20 kHz, damage was observed on the Sn—Ag plate. On the other hand, damage was not observed on the Cu plate even in a case of any frequency of 20 kHz, 60 kHz, and 100 kHz. There was no change in the state of the Sn—Ag plate and the Cu plate by the difference in the average power of the laser light.

Comparative Example 1

Next, using the irradiation apparatus in Comparative Example 1, each laser light having a frequency of 40 kHz, 60 kHz, 80 kHz, 100 kHz, and 140 kHz was irradiated to each laminate. The irradiation pitch when the frequency was 40 kHz and 60 kHz was set to 160 μm, and the irradiation pitch when the frequency was 80 kHz to 140 kHz was set to 100 μm. In addition, the irradiation rate when the frequency was 40 kHz to 80 kHz was set to 6000 mm/s, and the irradiation rate when the frequency was 100 kHz and 140 kHz was set to 10000 mm/s. The average power was fixed at 1.92 W, and the defocus was fixed at 4 mm.

As a result, in a case where the frequency was 40 kHz and 60 kHz, damage was observed on the Cu plate, and, in a case where the frequency was 80 kHz, damage was observed on a part of the Cu plate. In addition, damage was observed on the Sn—Ag plate at all frequencies.

Example 1 and Comparative Examples 1 and 2

Next, using each irradiation apparatus in Example 1 and Comparative Examples 1 and 2, laser light having a frequency of 100 kHz was irradiated to each laminate. At this time, the average power of the laser light from each irradiation apparatus was set to 1.80 W in Example 1, 1.92 W in Comparative Example 1, and 1.52 W in Comparative Example 2, respectively. In addition, in each irradiation apparatus, the irradiation pitch was set to 100 μm, the irradiation rate was set to 6000 mm/s, and the defocus was set to 5 mm.

In Example 1, the substrate and the support plate were separated (after the laser irradiation, the substrate and the support plate were separated by applying a slight force to the laminate), and in Comparative Examples 1 and 2, the substrate and the support plate were easily separated (after the laser irradiation, the substrate and the support plate were separated without applying a force to the laminate).

In each irradiation apparatus in Example 1 and Comparative Examples 1 and 2, the presence or the absence of damage on both surfaces of the Cu plate and the Sn—Ag plate was determined by SEM photographs. In the case of the irradiation apparatus in Example 1, damage was not observed on both surfaces of the Cu plate and the Sn—Ag plate. On the other hand, in a case of the irradiation apparatus in Comparative Example 1, damage was not observed on the Cu plate surface, however, damage was observed on the Sn—Ag plate surface. In addition, in the case of the irradiation apparatus in Comparative Example 2, damage was observed on both surfaces of the Cu plate and the Sn—Ag plate.

INDUSTRIAL APPLICABILITY

The present invention can be suitably used, for example, in a manufacturing step of a fine semiconductor apparatus.

REFERENCE SIGNS LIST

1 Laminate
11 Substrate
12 Support plate
14 Adhesive layer
16 Release layer

What is claimed is:

1. A supporting member separation method of separating a laminate formed by laminating a substrate, an adhesive layer, a release layer consisting of a fluorocarbon, wherein the fluorocarbon is film formed by a plasma chemical vapor deposition (CVD) method, and wherein the release layer loses, by absorbing light, strength or adhesiveness that the release layer has before being irradiated with light, and a supporting member in this order, the method comprising:
   irradiating the release layer with laser light which (i) is pulse-oscillated with a pulse having a pulse width of 20 ns or greater and 108.5 ns or less, (ii) has a frequency of 20 kHz or greater and 100 kHz or less, and (iii) is pulse light having an irradiation rate of 4000 mm/s or greater and 10000 mm/s or less; and
   separating the substrate and the release layer from each other by breaking the release layer through applying a external force to the release layer after the release layer is irradiated with the laser light.

2. The supporting member separation method according to claim 1, wherein the supporting member is constituted to transmit the laser light, and wherein in the irradiation step, the laser light is irradiated on the laminate from the supporting member side.

3. The supporting member separation method according to claim 2, wherein an electronic circuit is formed on a surface of the adhesive layer side of the substrate.

4. The supporting member separation method according to claim 1, wherein the laser light is 20 kHz or greater and 60 kHz or less.

5. The supporting member separation method according to claim 1, wherein a wavelength of light that can be absorbed by the release layer is in the range of 600 nm or less and, wherein an absorptivity of the light is 80%.

6. A supporting member separation apparatus for separating a laminate formed by laminating a substrate, an adhesive layer, a release layer consisting of a fluorocarbon, wherein the fluorocarbon is film-formed by a plasma chemical vapor deposition (CVD) method, and wherein the release layer loses, by absorbing light, strength or adhesiveness that the release layer has before being irradiated with light, and a supporting member in this order, the apparatus comprising:
   a laser configured to irradiate the release layer with laser light which (i) is pulse-oscillated with a pulse having a pulse width of 20 ns or greater and 108.5 ns or less, (ii) has a frequency of 20 kHz or greater and 100 kHz or less, and (iii) is pulse light having an irradiation rate of 4000 mm/s or greater and 10000 mm/s or less, wherein the laser is selected from the group consisting of a YAG laser, a ruby laser, a glass laser, a YVO4 laser, an LD laser, a fiber laser, a dye laser, a CO2 laser, an excimer laser, an Ar laser, a He—Ne laser, a semiconductor laser, and a free electron laser; and
   a separator configured to break the release layer through applying a external force to the release layer after the release layer is irradiated with the laser light, and thereby separate the substrate from the release layer.

7. The supporting member separation apparatus according to claim 6, wherein the laser light is 20 kHz or greater and 60 kHz or less.

8. The supporting member separation apparatus according to claim 6, wherein a wavelength of light that can be absorbed by the release layer is in the range of 600 nm or less and, wherein an absorptivity of the light is 80%.

* * * * *